US006569238B2

United States Patent
Ishida (10) Patent No.: US 6,569,238 B2
(45) Date of Patent: May 27, 2003

(54) APPARATUS AND METHOD FOR DEPOSITING SEMI CONDUCTOR FILM

(75) Inventor: Masahiro Ishida, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/864,218

(22) Filed: May 25, 2001

(65) Prior Publication Data

US 2001/0047750 A1 Dec. 6, 2001

(30) Foreign Application Priority Data

May 31, 2000 (JP) .................................... 2000-161550

(51) Int. Cl.[7] .............................................. C30B 23/00
(52) U.S. Cl. ............................ 117/84; 117/88; 117/90; 117/97
(58) Field of Search ........................... 117/90, 94, 106, 117/84, 88, 97

(56) References Cited

U.S. PATENT DOCUMENTS

| 4,874,464 A | * | 10/1989 | Goodwin et al. | ............ 117/102 |
| 5,334,277 A | * | 8/1994 | Nakamura | .................. 117/102 |
| 5,587,014 A | * | 12/1996 | Iyechika et al. | ............ 117/106 |
| 5,599,732 A | * | 2/1997 | Razeghi | ...................... 117/104 |
| 6,290,774 B1 | * | 9/2001 | Solomon et al. | ............ 117/102 |

FOREIGN PATENT DOCUMENTS

| EP | 0 308 695 | 3/1989 |
| JP | 08-213326 | 8/1996 |
| JP | 10-284425 | 10/1998 |

OTHER PUBLICATIONS

Patent Abstracts of Japan Publication No. 10–067584, "Reaction Vessel" Publication Date: Mar. 10, 1998.
Patent Abstracts of Japan Publication No. 11–080961, "Plasma Treatment Apparatus and Plasma Treatment" Publication Date: Mar. 26, 1999.
Patent Abstracts of Japan Publication No. 57–053930, "Device for Chemical Gaseous–Phase Growing" Publication Date: Mar. 31, 1982.
European Search Report Dated: Oct. 16, 2001.

* cited by examiner

*Primary Examiner*—Benjamin L. Utech
*Assistant Examiner*—Matthew Song
(74) *Attorney, Agent, or Firm*—Nixon Peabody LLP; Donald R. Studebaker (57) ABSTRACT

An apparatus for depositing a semiconductor film on a wafer, which is held on a holder inside a reactor, with at least one source gas supplied onto the wafer. The apparatus includes a decontamination film made of a semiconductor that contains at least one constituent element of the semiconductor film to be deposited. The decontamination film covers inner walls of the reactor, which are located upstream with respect to the source gas supplied and/or over the holder.

7 Claims, 5 Drawing Sheets

APPARATUS AND METHOD FOR DEPOSITING SEMI CONDUCTOR FILM

BACKGROUND OF THE INVENTION

The present invention relates to an apparatus for depositing a semiconductor film by a vapor phase epitaxy (VPE) process and a method for depositing a semiconductor film using the apparatus. More particularly, this invention relates to an apparatus and method for depositing a semiconductor film while decontaminating a reactor or preventing the film being deposited from being contaminated with reactants adhered to, and then dropped off, the walls of the reactor.

A Group III–V nitride compound semiconductor, represented by the general formula $Al_xGa_yIn_{1-x-y}N$ (where $0 \leq x+y \leq 1$), is effectively applicable as a material for a violet or blue light emitting diode (LED) or a blue light emitting laser diode (LD) for use in high-density optical recording. A nitride compound semiconductor film is normally deposited by a metalorganic vapor phase epitaxy (MOVPE) or hydride vapor phase epitaxy (HVPE) process. Specifically, in an MOVPE process, source gases of Group III and V elements (e.g., a gas of an organic metal like trimethylgallium (TMG) and an ammonia ($NH_3$) gas, respectively) are supplied onto a wafer and allowed to react with each other at about 1000° C., thereby growing nitride semiconductor crystals thereon. In an HVPE process on the other hand, source gases of a Group III chloride and a Group V element are supplied onto a wafer and allowed to react with each other at about 1000° C., thereby growing nitride semiconductor crystals thereon. In the latter process, the Group III chloride may be obtained by making a Group III metal element such as gallium (Ga) react with hydrogen chloride (HCl), while the Group V element may be ammonium, for example.

A reactor for use in the MOVPE or HVPE process should be made of a material that does not react with $H_2$ or $NH_3$ gas so easily at the elevated temperature of 1000° C or more. So in the prior art, part of the reactor to be heated is made of quartz or graphite coated with silicon carbide (SiC), for example.

The known semiconductor film deposition apparatus (i.e., the MOVPE or HVPE reactor), however, has the following two drawbacks.

Firstly, the semiconductor film being deposited on the wafer is likely contaminated with some impurities other than the Group III and V elements. For example, where a nitride compound semiconductor film is deposited using a reactor made of quartz, the heated quartz reacts with a source or carrier gas (e.g., $NH_3$ or $H_2$ gas), thus carrying silicon (Si) and oxygen (O) atoms, i.e., constituent elements of quartz, onto the wafer. As a result, the semiconductor film deposited on the wafer will eventually contain these contaminants at a concentration of about $10^{13}$ $cm^{-3}$ to about $10^{18}$ $cm^{-3}$.

A nitride compound semiconductor film, which has been deposited using a reactor made of SiC., will also contain contaminants like Si and C atoms at a concentration of about $10^{13}$ $cm^{-3}$ to about $10^{18}$ $cm^{-3}$. Even though their amounts are usually small, these impurities other than the Group III and V elements likely deteriorate the characteristics of a semiconductor device that will be formed out of the semiconductor film deposited. For example, the operating current of the semiconductor device increases unexpectedly.

Secondly, some flaky reactants likely drop off the inner walls of the reactor onto the semiconductor film being deposited on the wafer. Most of the reactants of the source gases deposit themselves on the wafer, but some of them may be deposited on the surrounding walls of the reactor that have been heated to about 300° C. Normally, the nitride compound semiconductor reactants poorly adhere to the walls of the reactor made of quartz or silicon carbide. Accordingly, the reactants, once deposited on the walls, easily drop off the walls during the film deposition process and some flaky ones of the reactants drop off the walls onto the film being deposited on the wafer. If those flaky contaminants dropped onto the film, part of the film could not be formed as originally intended. As a result, a semiconductor device that will be formed out of the film could not operate properly.

SUMMARY OF THE INVENTION

It is therefore an object of the present invention to prevent a semiconductor film being deposited by a VPE process from being contaminated with those droppings.

An inventive apparatus is for use to deposit a semiconductor film on a wafer, which is held on a holder inside a reactor, with at least one source gas supplied onto the wafer. To achieve the above object, the apparatus includes a decontamination film made of a semiconductor that contains at least one constituent element of the semiconductor film to be deposited. The decontamination film covers inner walls of the reactor, which are located upstream with respect to the source gas and/or over the holder.

Using the inventive apparatus, the semiconductor film being deposited on the wafer will contain no contaminants including elements other than the constituent elements of the semiconductor film. Accordingly, a semiconductor device, which will be formed out of the semiconductor film deposited on the wafer, will not have its operating characteristics deteriorated.

It should be noted that a similar technique is disclosed in Japanese Laid-Open Publication No. 10-284425, in which a platter, a type of wafer holder, is coated with a nitride semiconductor film to deposit a crystal layer uniformly on a wafer. The coating, however, cannot eliminate the contaminants completely and the technique is much less effective than the technique of the present invention.

In one embodiment of the present invention, the decontamination film preferably also covers parts of the holder that had been exposed inside the reactor before the decontamination film was formed thereon.

In another embodiment of the present invention, the decontamination film may be made of a Group III–V compound semiconductor. Then, the reactants, which will be deposited on the wafer to form the intended semiconductor film thereon, strongly adheres to the decontamination film. Accordingly, no flakes will drop onto the film being deposited on the wafer.

Specifically, the decontamination film preferably covers the inner walls of the reactor and parts of the holder that would have been exposed to the source gas without the decontamination film and that have a temperature of about 300° C. or more at the surface thereof when the reactor is heated.

Alternatively, the decontamination film may contain aluminum. This is because where the Group III–V compound semiconductor contains aluminum, the semiconductor film will have a higher decomposition temperature and the decontamination film can adhere to the specified parts more strongly.

More particularly, an aluminum mole fraction of the decontamination film is preferably greater than that of the semiconductor film being deposited on the wafer. Then, the decomposition temperature of the decontamination film is higher than that of the semiconductor film being deposited on the wafer. Accordingly, the decontamination film does not disappear while the semiconductor film is being deposited.

In this particular embodiment, the decontamination film is preferably made of aluminum nitride.

In still another embodiment, the reactor may be made of quartz.

In yet another embodiment, the holder may be made of graphite, and the decontamination film may be formed on an undercoat film that covers the surface of the holder and that contains silicon carbide or boron nitride. In that case, even if the holder is made of graphite, the decontamination film can strongly adhere to the holder, because the decontamination film is formed on an undercoat film of silicon carbide or boron nitride.

A first inventive method for depositing a semiconductor film includes the step of a) introducing source gases, containing aluminum and nitrogen, respectively, into a reactor including a holder therein while heating the reactor before a wafer is loaded into the reactor, thereby forming a decontamination film, containing aluminum and nitrogen, on inner walls of the reactor and on parts of the holder exposed to the source gases. The method further includes the step of b) placing a wafer on part of the decontamination film that has covered the holder and then supplying Group III and V source gases onto the wafer, thereby depositing a Group III–V compound semiconductor film on the wafer. And the method further includes the step of c) unloading the wafer, on which the Group III–V compound semiconductor film has been deposited, from the reactor, and then heating the reactor and the holder up to a temperature that is equal to or higher than a decomposition temperature of the Group III–V compound semiconductor film and equal to or lower than a decomposition temperature of the decontamination film, thereby removing excessive reactants that have deposited themselves on the decontamination film covering the inner walls of the reactor and the holder.

In the first method, a decontamination film is formed inside a reactor before a Group III–V compound semiconductor film is deposited on a wafer. After the film has been deposited thereon, the wafer is unloaded from the reactor and then the reactor and holder are heated to a temperature equal to or higher than a decomposition temperature of the Group III–V compound semiconductor film and equal to or lower than that of the decontamination film. In this manner, excessive reactants, which deposited themselves on the decontamination film covering the inner walls of the reactor and the holder while the semiconductor film was deposited, can be removed. Accordingly, every time a wafer is loaded into the reactor, a desired semiconductor film can be deposited on the wafer uniformly enough.

In one embodiment of the present invention, the step c) may be carried out within a reducing environment. In the reducing environment, a Group III–V compound semiconductor film (e.g., a nitride compound semiconductor film, in particular) has a relatively low decomposition temperature compared to an inert gas environment. Thus, the reactants deposited can be removed at a lower temperature.

Specifically, the reducing environment preferably contains hydrogen gas. Then, the excessive reactants are removable without contaminating the apparatus because hydrogen gas can have very high purity through purification.

A second inventive method for depositing a semiconductor film includes the step of a) introducing source gases, containing aluminum and nitrogen, respectively, into a reactor including a holder therein while heating the reactor before a wafer is loaded into the reactor, thereby forming a decontamination film, containing aluminum and nitrogen, on inner walls of the reactor and on parts of the holder exposed to the source gases. The method further includes the step of b) placing a wafer on part of the decontamination film that has covered the holder and then forming an undercoat semiconductor layer, having substantially the same composition as the decontamination film, on the principal surface of the wafer. The method further includes the step of c) supplying Group III and V source gases onto the undercoat semiconductor layer, thereby depositing a Group III–V compound semiconductor film on the undercoat semiconductor layer.

In the second method, a decontamination film is formed in advance inside a reactor, and then an undercoat semiconductor layer, having substantially the same composition as the decontamination film, is formed on the principal surface of the wafer. Accordingly, every time a wafer is loaded into a reactor, the surface of the decontamination film already existing inside the reactor is covered with reactants having substantially the same composition as the decontamination film. Thus, the decontamination film can have its lifetime extended remarkably.

In one embodiment of the present invention, the second method may further include the step of d) unloading the wafer, on which the Group III–V compound semiconductor film has been deposited, from the reactor, and then heating the reactor and the holder up to a temperature that is equal to or higher than a decomposition temperature of the Group III–V compound semiconductor film and equal to or lower than that of the decontamination film, thereby removing excessive reactants that have deposited themselves on the decontamination film covering the inner walls of the reactor and the holder. Then, excessive reactants, which deposited themselves on the decontamination film covering the inner walls of the reactor and the holder while the semiconductor film was deposited, can be removed. Accordingly, every time a wafer is loaded, a desired semiconductor film can be deposited on the wafer uniformly enough.

In another embodiment of the present invention, the step c) may include depositing the Group III–V compound semiconductor film that has an aluminum mole fraction smaller than that of the decontamination film. Then, the reactants having the lower Al mole fraction are removable from the decontamination film in the step d), thus eliminating flakes almost completely.

In still another embodiment, the step d) may be carried out within a reducing environment. In that case, the reducing environment preferably includes hydrogen gas.

DESCRIPTION OF THE PREFERRED EMBODIMENTS

Embodiment 1

Hereinafter, a first embodiment of the present invention will be described with reference to the accompanying drawings.

Figure 1:
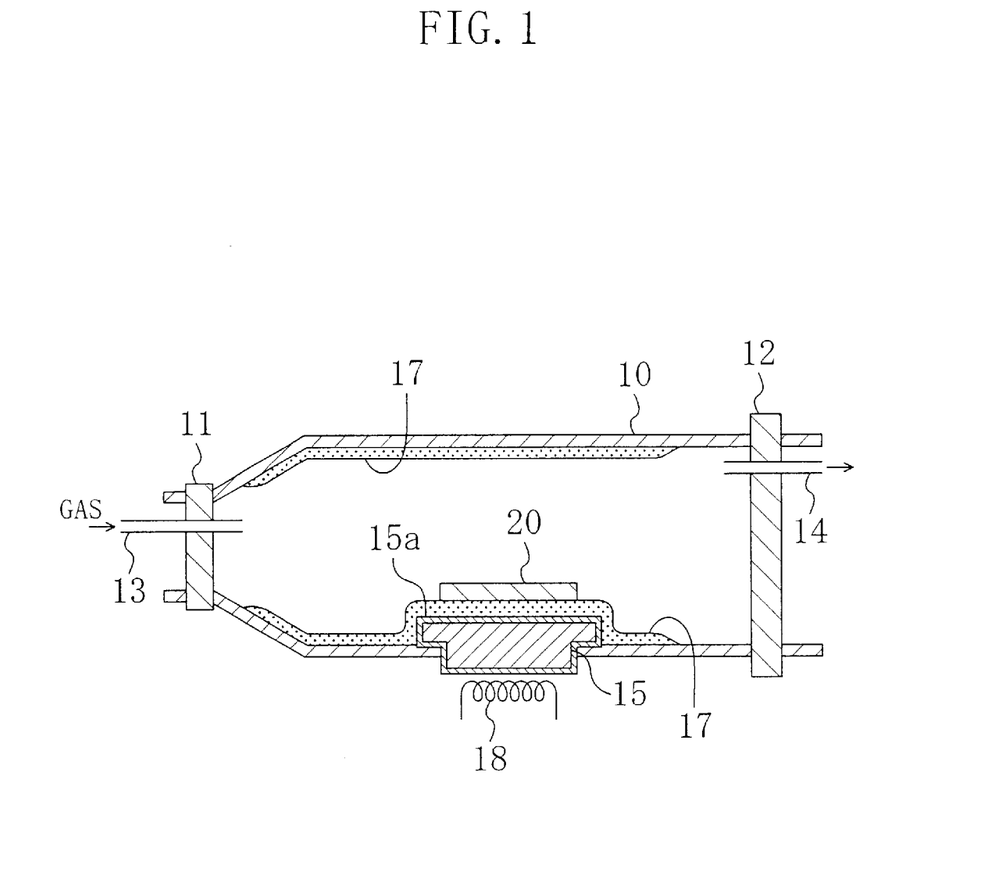
FIG. 1 is a cross-sectional view illustrating a structure for a semiconductor film deposition apparatus according to a first embodiment of the present invention.

FIG. 1 illustrates a cross-sectional structure for a semiconductor film deposition apparatus according to the first embodiment.

As shown in FIG. 1, a cylindrical reactor 10 of quartz tapers off to one of its ends, through which source and carrier gases are introduced. The reactor 10 is sealable airtight with first and second seal members 11 and 12, which have been fitted in two openings of the reactor 10 located on the gas inlet and outlet ends, respectively. Although the reactor 10 shown in FIG. 1 is sealed, these members 11 and 12 are removable when a wafer is loaded or unloaded into/from the reactor 10. Specifically, a gas inlet tube 13 is inserted into the opening of the first seal member 11 to introduce the source and carrier gases into the reactor 10. The second seal member 12 has a gas outlet tube 14 to exhaust unnecessary gases from the reactor 10.

The bottom of the reactor 10 has an opening, in which a susceptor 15 of graphite has been fitted airtightly. The susceptor 15 is an exemplary wafer holder and has its lower part exposed out of the reactor 10. The surface of the susceptor 15 is covered with an undercoat film 15a of SiC. The film 15a may be deposited to a thickness of about 200 $\mu$m by heating the susceptor 15 within a silane ($SiH_4$) gas environment.

In the reactor 10, a decontamination film 17 of AlN has been deposited to cover the inner walls of the reactor 10 that are located upstream with respect to the gases introduced and over the susceptor 15. The decontamination film 17 also covers the surface of the susceptor 15 that had been exposed before the undercoat film 15a was formed thereon. In the illustrated embodiment, the decontamination film 17 is deposited to a thickness of about 50 $\mu$m. However, any other thickness (e.g., from about 5 $\mu$m to about 100 $\mu$m) may be selected appropriately so long as the film 17 can be deposited uniformly.

A heater 18 is disposed under the susceptor 15 to heat the susceptor 15 itself and a wafer 20 held on the susceptor 15. While the heater 18 is powered, the heat radiated from the heater 18 and susceptor 15 raises the temperature of the reactor 10.

Hereinafter, it will be described how the decontamination film 17 may be formed.

First, the reactor 10, in which the decontamination film 17 has not been formed yet but which already includes the susceptor 15 covered with the undercoat film 15a, is placed inside the apparatus. At this time, the wafer 20 is not yet placed on the susceptor 15. Next, trimethylaluminum (TMA) and $NH_3$ gases are introduced into the reactor 10 with $H_2$ gas supplied as a carrier gas while the susceptor 15 gets heated up to about 1200° C. by the heater 18.

Then, the TMA and $NH_3$ gases react with each other to form the decontamination film 17 of AlN on parts of the susceptor 15 and reactor 10 that have their surface temperatures raised to 300° C. or more by the heat radiated.

Thereafter, when the decontamination film 17 is deposited to a predetermined thickness, the supply of the TMA and $NH_3$ gases is stopped and the heater 18 is also switched off.

As described above, according to the first embodiment, the decontamination film 17 of AlN can be deposited on the inner walls of the reactor 10 and over the susceptor 15 without using any other specially designed film deposition apparatus but the reactor 10.

The decontamination film 17 can be deposited selectively over those parts of the inner walls of the reactor 10 and susceptor 15 that have been heated to 300° C. or more. Accordingly, this embodiment of the present invention is applicable not just to reactors of the "cold wall" type including an MOVPE reactor but also to reactors of the "hot wall" type including an HVPE reactor. The cold- and hot-wall reactors are so termed because the walls of these reactors are cooled and heated, respectively.

The decontamination film 17 may also be deposited by a sputtering process. In that case, however, a sputtering apparatus is additionally needed.

In the foregoing illustrative embodiment, the decontamination film 17 is made of AlN. Alternatively, the decontamination film 17 may have any arbitrary composition as represented by the general formula $Al_xGa_yIn_{1-x-y}N$ (where $0 \leq x \leq 1$, $0 \leq y \leq 1$ and $0 \leq x+y \leq 1$). In that case, trimethylgallium (TMG), TMA and/or trimethylindium (TMI) gases may be supplied into the reactor 10 at respective flow rates that are determined appropriately depending on the mole fractions x and y. It should be noted, however, that where the decontamination film 17 of a nitride compound semiconductor should be formed on the surface of the members of SiC or quartz, the film 17 preferably includes Al. This is because a nitride compound semiconductor not including Al poorly adheres to the surface of those members of SiC or quartz.

Also, in the foregoing embodiment, the undercoat film 15a for the susceptor 15 of graphite is made of SiC. Alternatively, the film 15a may also be made of boron nitride (BN) and may be deposited to almost the same thickness.

Moreover, in the first embodiment, the reactor 10 is a horizontal reactor in which source and carrier gases are introduced horizontally to the principal surface of the wafer 20. Alternatively, a vertical reactor, in which source and carrier gases are introduced vertically to the principal surface of the wafer 20, may also be used and the same effects are attainable.

Furthermore, if the susceptor 15 is made of SiC., then there is no need to form the undercoat film 15a. And where the susceptor 15 is made of molybdenum (Mo), the undercoat film 15a should be made of such a material as increasing the adhesion of the decontamination film 17 of AlN.

We deposited gallium nitride (GaN) films using the inventive apparatus including the decontamination film 17 and a known apparatus not including the decontamination film 17. The results of the experiments will follow soon and the conditions thereof are as follows.

A sapphire wafer with a (0001) principal surface and with a diameter of about 5.1 cm (i.e., about 2 inches) was used as the wafer 20. An HVPE process was carried out using purified $H_2$ as a carrier gas, gallium chloride (GaCl) as a Group III source gas and $NH_3$ as a Group V source gas, respectively. The GaCl gas was obtained by allowing hydrogen chloride (HCl) to react with Ga.

The GaN films were deposited in the following manner. First, the wafer 20 was placed on the susceptor 15 inside the reactor 10. Next, the wafer 20 was heated to a relatively low temperature of about 600° C., thereby depositing a buffer layer of GaN to a thickness of about 1 $\mu$m on the wafer 20. Thereafter, the wafer 20 had its temperature raised to about 1000° C. and then a semiconductor film of GaN was deposited to a thickness of about 50 μm.

The concentrations of the impurities, including silicon (Si), oxygen (O) and carbon (C) atoms, in the semiconductor film deposited were measured by secondary ion mass spectrometry (SIMS). As a result, the impurity concentrations were less than the limit of measurement (i.e., $10^{13}$ cm$^{-3}$) or less in the semiconductor film deposited using the apparatus of the first embodiment.

In the semiconductor film deposited using the known apparatus on the other hand, the Si, O and C concentrations measured were $1\times10^{16}$ cm$^{-3}$, $2\times10^{16}$ cm$^{-3}$ and $1\times10^{16}$ cm$^3$, respectively. In this case, the Si, O and C atoms were mixed into the GaN layer on the wafer 20 as a result of reaction of quartz or SiC with NH$_3$, for example.

Next, it will be described how many flakes dropped onto the wafer 20 for the inventive and known apparatuses.

Supposing a fabrication process performed under the conditions specified above to be a single deposition process, the fabrication process was repeatedly carried out forty times or more. The number of times the fabrication process was performed is equivalent to the number of wafers loaded into the reactor 10. So in the following description, the number of times will be represented by the number of wafers loaded. In the experiments to be described below, however, the buffer layer was deposited to about 50 nm and the nitride compound semiconductor film was deposited to about 5 μm.

Figure 2:
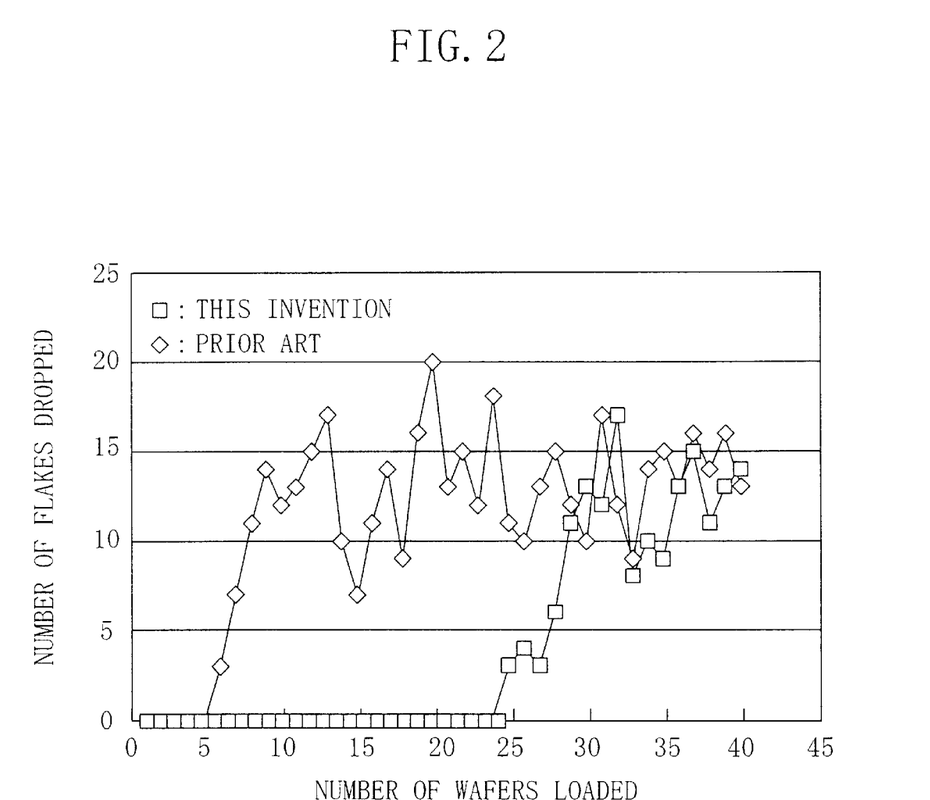
FIG. 2 is a graph illustrating relationships between the number of wafers loaded and the number of flakes dropped onto the wafer for the apparatus of the first embodiment and a known apparatus.

FIG. 2 illustrates relationships between the number of wafers loaded and the number of flakes dropped onto the wafer for the apparatus of the first embodiment and a known apparatus. As shown in FIG. 2, where the known apparatus was used, the flakes started to drop as early as when the number of wafers loaded reached six. In contrast, where the apparatus of the first embodiment was used, no flakes dropped at all until twenty-five wafers were loaded into the reactor 10.

In the known apparatus, the reactants of the nitride compound semiconductor film to be deposited poorly adhere to quartz as a material for the reactor 10 or SiC as a material for the undercoat film 15a on the susceptor 15. Accordingly, those nitride compound semiconductor reactants are once deposited on the reactor 10 and susceptor 15 but soon drop off easily as flakes.

In the apparatus of the first embodiment on the other hand, the decontamination film 17 strongly adheres to quartz and SiC and the nitride compound semiconductor reactants also strongly adhere to the decontamination film 17 during the deposition process. For that reason, flakes do not appear so soon. However, the greater the number of wafers loaded, the thicker the nitride compound semiconductor reactants deposited on the decontamination film 17. And the thick film of the reactants is heated over and over again. Then, cracks will be formed in the thick film of the nitride compound semiconductor deposited on the decontamination film 17 due to a difference in thermal expansion coefficient. As a result, flakes start to drop onto the wafer 20.

Part of the semiconductor film deposited, onto which the flakes dropped, will cause failures when the film forms an integral part of a semiconductor device. Thus, it is normally necessary to do maintenance on the reactor 10 (e.g., clean the reactor 10) before those flakes start to drop.

Accordingly, the known apparatus requires maintenance every time five wafers have been loaded into the reactor. In contrast, the apparatus of the first embodiment needs maintenance after as many as twenty-five wafers have been loaded into the reactor 10. That is to say, the first embodiment of the present invention increases the maintenance interval fivefold, thus boosting the productivity remarkably. In summary, the apparatus of the first embodiment can eliminate the contaminants from the film being deposited almost completely while drastically reducing the number of times maintenance is needed per unit time. Thus, the apparatus can grow high-purity nitride compound semiconductor crystals very efficiently. This means that a wafer of high-purity GaN crystals can also be prepared according to the present invention.

In the foregoing illustrative embodiment, the decontamination film 17 is made of a nitride compound semiconductor. However, where the decontamination film 17 is made of Si alone, the apparatus of the first embodiment can also grow high-purity semiconductor crystals containing Si.

Embodiment 2

Hereinafter, a semiconductor film depositing method according to a second embodiment of the present invention will be described.

We deposited GaN films using the inventive apparatus including the decontamination film 17 and a known apparatus not including the decontamination film 17. The results of the experiments will follow soon and the conditions thereof are as follows.

A sapphire wafer with a (0001) principal surface and with a diameter of about 5.1 cm was used as the wafer 20. An MOVPE process was carried out using purified H$_2$, TMG and NH$_3$ gases as carrier, Group III source and Group V source gases, respectively.

The GaN films were deposited in the following manner. First, the wafer 20 was placed on the susceptor 15 inside the reactor 10 shown in FIG. 1. Next, the wafer 20 was heated to a relatively low temperature of about 600° C., thereby depositing a buffer layer of GaN to a thickness of about 50 nm on the wafer 20. Thereafter, the wafer 20 had its temperature raised to about 1000° C. and then a semiconductor film of GaN was deposited to a thickness of about 5 μm.

Subsequently, the wafer 20 on which the semiconductor film had been deposited was unloaded from the reactor 10 and then the reactor 10 and susceptor 15 were heated for about 30 minutes within hydrogen environment at about 1200° C., thereby removing the reactants deposited onto the inner walls of the reactor 10 and the surface of the susceptor 15.

Supposing a fabrication process performed under the conditions specified above to be a single deposition process, we investigated how the number of flakes dropped onto the wafer 20 changed with the number of times the fabrication process was carried out.

Figure 3:
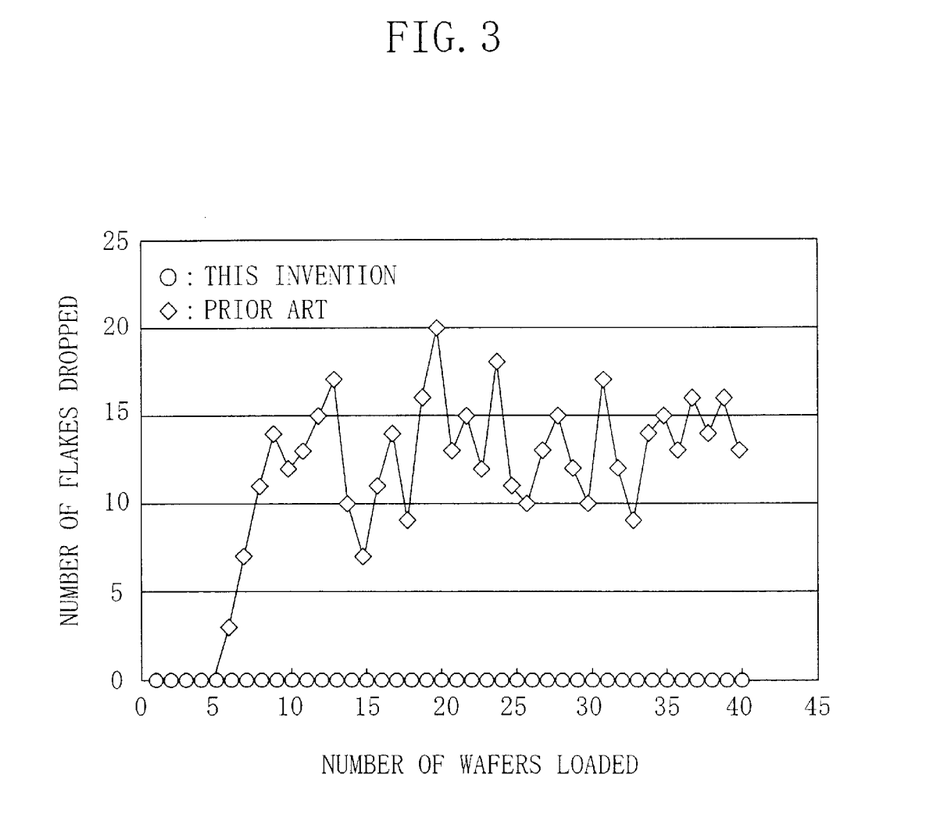
FIG. 3 is a graph illustrating relationships between the number of wafers loaded and the number of flakes dropped onto the wafer for a method according to a second embodiment of the present invention and a known method.

FIG. 3 illustrates relationships between the number of wafers loaded and the number of flakes dropped onto the wafer for the method of the second embodiment and the known method. As shown in FIG. 3, the excessive reactants like GaN, which had been deposited onto the decontamination film 17, decomposed and sublimed according to the second embodiment because the reactor 10 was heated within the hydrogen environment. That is to say, no flakes dropped onto the wafer 20 at all.

In the second embodiment, the reactor 10 is heated within the hydrogen environment at about 1200° C. to remove the contaminants. However, if any other gas is used as the ambient gas, then the reactor 10 should be heated up to a different temperature because GaN will decompose at a different temperature.

Generally speaking, GaN decomposes at a relatively low temperature within a reducing environment. Accordingly, a reducing environment is preferred because the excessive reactants, like GaN, deposited on the members of the reactor are removable at a lower temperature. Furthermore, when hydrogen gas is used as in the second embodiment, the total amount of impurities contained in the gas can be very small because hydrogen gas can have high purity through purification.

Embodiment 3

Hereinafter, a semiconductor film depositing method according to a third embodiment of the present invention will be described.

A sapphire wafer with a (0001) principal surface and with a diameter of about 5.1 cm was used as the wafer 20. An MOVPE process was carried out using purified $H_2$ as a carrier gas, TMG, TMA and TMI as Group III source gases and $NH_3$ as a Group V source gas, respectively.

First, the wafer 20 was placed on the susceptor 15 inside the reactor 10 shown in FIG. 1. Next, the wafer 20 was heated to a relatively low temperature of about 600° C., thereby depositing a buffer layer of GaN to a thickness of about 50 nm on the wafer 20. Thereafter, the wafer 20 had its temperature raised to about 1000° C. and then first contact layer of n-GaN, first cladding layer of n-$Al_{0.2}Ga_{0.8}N$ and first light guide layer of n-GaN were deposited in this order to about 3 μm, about 0.5 μm and about 0.1 μm, respectively, on the wafer 20. In the illustrated embodiment, Si was used as an n-type dopant.

Next, the wafer 20 had its temperature lowered to about 800° C. and then a multiple quantum well (MQW) active layer of InGaN, including multiple well and barrier layers alternately stacked to a thickness of about 3 nm each and to a thickness of about 5 nm each, respectively, was formed on the first light guide layer.

Thereafter, the wafer 20 had its temperature raised to about 1000° C. again and then second light guide layer of p-GaN, second cladding layer of p-$Al_{0.2}Ga_{0.8}N$ and second contact layer of p-GaN were deposited in this order to about 0.1 μm, about 0.5 μm and about 1 μm, respectively, on the MQW active layer. In this manner, a multilayer structure of nitride compound semiconductor crystal layers was formed to make up a laser diode. In the illustrated embodiment, magnesium (Mg) was used as a p-type dopant.

Subsequently, the wafer 20 on which these semiconductor crystal layers had been deposited was unloaded from the reactor 10 and then the reactor 10 and susceptor 15 were heated for about 30 minutes within hydrogen environment at about 1250° C., thereby removing the reactants deposited on the inner walls of the reactor 10 and the surface of the susceptor 15.

Supposing a fabrication process performed under the conditions specified above to be a single deposition process, we investigated how the number of flakes dropped onto the wafer changed with the number of times the fabrication process was carried out.

In the third embodiment, the reactor 10 was also heated within the hydrogen environment to remove the excessive reactants as in the second embodiment. Accordingly, the excessive reactants like AlGaN, which had been deposited onto the decontamination film 17, decomposed and sublimed, too. That is to say, no flakes dropped onto the wafer 20 at all, no matter how many wafers were loaded into the reactor 10.

The first and second cladding layers of $Al_{0.2}Ga_{0.8}N$ have the highest decomposition temperature of about 1200° C. For that reason, the reactor 10 was heated in the third embodiment to a higher temperature of about 1250° C. to remove the contaminants. It should be noted that if the decontamination film 17 has a decomposition temperature lower than that of any nitride compound semiconductor layer included in the multilayer structure, then the heat treatment should be stopped before the temperature of the decontamination film 17 reaches its decomposition temperature.

For that reason, the decontamination film 17 is preferably made of a material with a decomposition temperature higher than that of any nitride compound semiconductor layer included in the multilayer structure lest the film 17 should be decomposed by the heat treatment conducted to remove the contaminants. In general, a nitride compound semiconductor will have its decomposition temperature raised when the Al mole fraction thereof is increased. Accordingly, in the third embodiment, the decontamination film 17 preferably has an Al mole fraction of greater than 0.2.

More preferably, the decontamination film 17 should be made of AlN as in the first embodiment. Then, the decontamination film 17 will be applicable to an apparatus for depositing a nitride compound semiconductor film with any arbitrary composition.

Embodiment 4

Hereinafter, a semiconductor film depositing method according to a fourth embodiment of the present invention will be described with reference to the accompanying drawings.

The fourth embodiment of the present invention is characterized in that an undercoat semiconductor layer on the wafer has the same composition as the decontamination film 17.

A sapphire wafer with a (0001) principal surface and with a diameter of about 5.1 cm was used as the wafer 20. An MOVPE process was carried out using purified $H_2$ as a carrier gas, TMG, TMA and TMI as Group III source gases and $NH_3$ as a Group V source gas, respectively.

Figure 4:
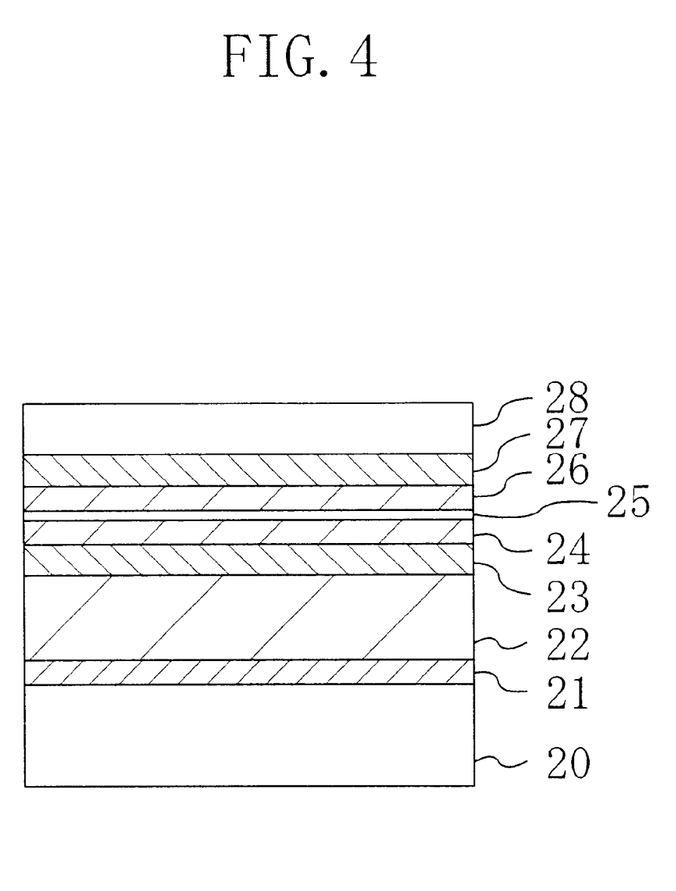
FIG. 4 is a cross-sectional view illustrating a structure for a laser diode formed by a semiconductor film depositing method according to a fourth embodiment of the present invention.

First, the wafer 20 was placed on the susceptor 15 inside the reactor 10 shown in FIG. 1. Next, the wafer 20 was heated to a relatively high temperature of about 1200° C., thereby depositing an undercoat semiconductor layer 21 of AlN to a thickness of about 50 nm on the wafer 20 as shown in FIG. 4. AlN can make good contact with sapphire and can be grown on the sapphire wafer 20 at that high temperature with no buffer layer interposed between them.

Thereafter, the wafer 20 had its temperature decreased to about 1000° C. and then first contact layer 22 of n-GaN, first cladding layer 23 of n-$Al_{0.2}Ga_{0.8}N$ and first light guide layer 24 of n-GaN were deposited in this order to about 3 μm, about 0.5 μm and about 0.1 μm, respectively, on the undercoat semiconductor layer 21.

Next, the wafer 20 had its temperature lowered to about 800° C. and an MQW active layer 25 of InGaN, including multiple well and barrier layers alternately stacked to a thickness of about 3 nm each and to a thickness of about 5 nm each, respectively, was formed on the first light guide layer 24.

Thereafter, the wafer 20 had its temperature raised to about 1000° C. again and then second light guide layer 26 of p-GaN, second cladding layer 27 of p-$Al_{0.2}Ga_{0.8}N$ and second contact layer 28 of p-GaN were deposited in this order to about 0.1 μm, about 0.5 μm and about 1 μm, respectively, on the MQW active layer 25. In this manner, a multilayer structure of nitride compound semiconductor crystal layers was formed to make up a laser diode.

Subsequently, the wafer 20 on which these semiconductor crystal layers had been deposited was unloaded from the reactor 10 and then the reactor 10 and susceptor 15 were heated for about 30 minutes within hydrogen environment at about 1250° C., thereby removing the reactants deposited onto the inner walls of the reactor 10 and the surface of the susceptor 15.

Supposing a fabrication process performed under the conditions specified above to be a single deposition process, we investigated how the number of flakes dropped onto the wafer changed with the number of times the fabrication process was carried out.

In the fourth embodiment, the reactor 10 was also heated within the hydrogen environment as in the second and third embodiments. Accordingly, the excessive reactants like AlGaN, which had been deposited onto the decontamination film 17, decomposed and sublimed, too. That is to say, no flakes dropped onto the wafer 20 at all, no matter how many wafers were loaded into the reactor 10.

Figure 5:
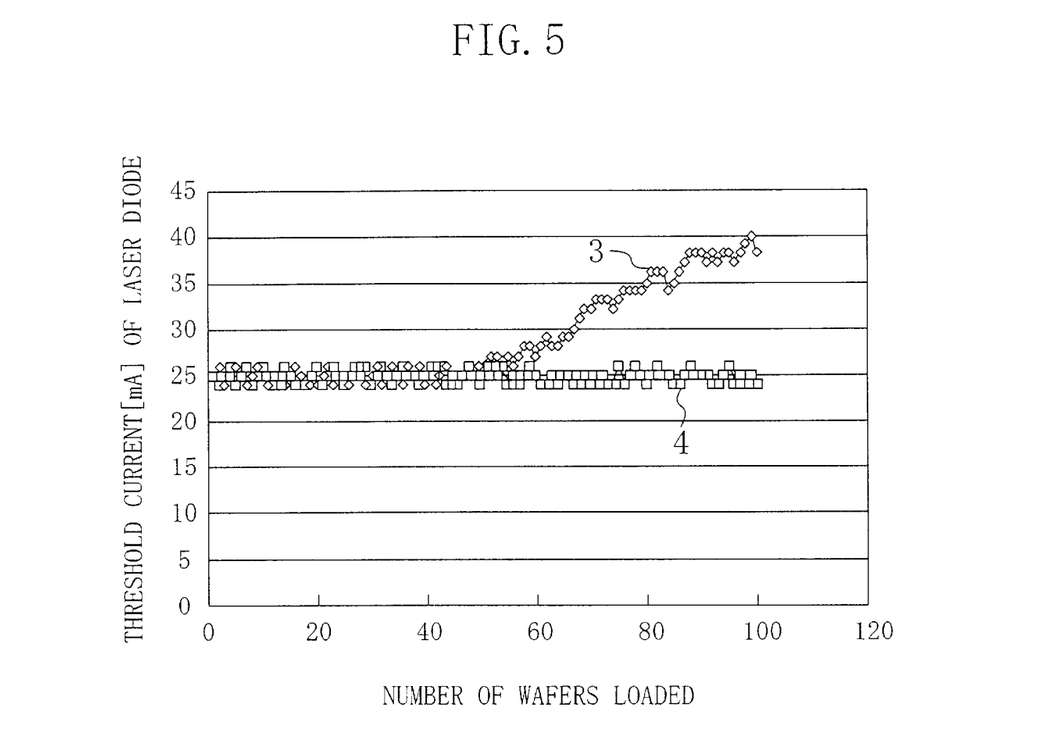
FIG. 5 is a graph illustrating how the threshold current of a laser diode, formed by the method of the third or fourth embodiment of the present invention, changes with the number of wafers loaded.

FIG. 5 illustrates how the threshold current of the laser diode, formed by the method of the third or fourth embodiment of the present invention, changes with the number of wafers loaded. As represented by the curve 3 shown in FIG. 5, once the number of wafers loaded reaches around fifty, the threshold current starts to rise gradually in the laser diode of the third embodiment. In contrast, the threshold current does not increase at all in the laser diode of the fourth embodiment as represented by the curve 4 shown in FIG. 5.

We investigated the reason why the laser diode of the third embodiment increased its threshold current. As a result, we found that impurities such as Si and O atoms entered the MQW active layer. The mixture of these impurities into the MQW active layer occurred probably in the following manner. Specifically, the decontamination film 17 is gradually degradable thermally as the number of wafers loaded or the number of times of the decontaminating heat treatment within the hydrogen environment increases. Then, tiny pinholes or cracks are formed in increasing numbers in the decontamination film 17. As a result, the constituent elements of the reactor 10 or susceptor 15 should pass through those holes or cracks and enter the crystal layers being deposited. For that reason, to prevent the increase in threshold current of the laser diode, the method of the third embodiment needs maintenance at regular intervals. Or the decontamination film 17 should be re-deposited after a certain period of use.

In contrast, according to the method of the fourth embodiment, the undercoat semiconductor layer 21 with the same composition (i.e., AlN) as the decontamination film 17 is formed on the principal surface of the wafer 20. Accordingly, every time a wafer 20 is newly loaded, the AlN film is also deposited on the surface of the decontamination film 17 that covers the susceptor 15 and the inner walls of the reactor 10. In other words, every time the deposition process is newly started, the surface of the decontamination film 17 of AlN is renewed. Thus it is possible to prevent those pinholes or cracks from being formed in the decontamination film 17. As a result, the interval of maintenance needed for the deposition apparatus can be much extended according to the fourth embodiment.

Although not shown in FIG. 4, n- and p-side electrodes are respectively formed on an exposed surface of the first contact layer 22 and on the second contact layer 28 in the laser diode of the third or fourth embodiment.

What is claimed is:

1. A method of depositing a semiconductor film, comprising the steps of:
   a) introducing source gases, containing aluminum and nitrogen, respectively into a reactor including a holder therein while heating the reactor before a wafer is loaded into the reactor, thereby forming a decontamination film, containing aluminum and nitrogen, on inner walls of the reactor and on parts of the holder exposed to the source gases;
   b) placing a wafer on part of the decontamination film that has covered the holder and then supplying Group III and V source gases onto the wafer, thereby depositing a Group III–V compound semiconductor film on the wafer and Group III–V reactants on the decontamination film; and
   c) after repeating step b) for multiple wafers, unloading the wafer, on which the Group III–V compound semiconductor film has been deposited, from the reactor, and then heating the reactor and the holder up to a temperature that is equal to or higher than a decomposition temperature of the Group III–V compound semiconductor film and equal to or lower than a decomposition temperature of the decontamination film, thereby removing by thermal decomposition excessive Group III–V reactants that have deposited themselves on the decontamination film, covering the inner wall of the reactor and the holder.

2. The method of claim 1, wherein the step c) is carried out within a reducing environment.

3. The method of claim 2, wherein the reducing environment comprises hydrogen gas.

4. A method of depositing a semiconductor film, comprising the steps of:
   a) introducing source gases, containing aluminum and nitrogen, respectively, into a reactor including a holder therein while heating the reactor before a wafer is loaded into the reactor, thereby forming a decontamination film, containing aluminum and nitrogen, on inner walls of the reactor and on parts of the holder exposed to the source gases;
   b) placing a wafer on part of the decontamination film that has covered the holder and then forming an undercoat semiconductor layer, having the same composition as the decontamination film, on the principal surface of the wafer;
   c) supplying Group III and V source gases onto the undercoat semiconductor layer, thereby depositing a Group III–V compound semiconductor layer on the undercoat semiconductor layer and Group III–V reactants on the decontamination film; and
   d) after repeating steps b) and c) for multiple wafers, unloading the wafer, on which the Group III–V compound semiconductor film has been deposited, from the reactor, and then heating the reactor and the holder up to a temperature that is equal to or higher than a decomposition temperature of the Group III–V compound semiconductor film and equal to or lower than a decomposition temperature of the decontamination film, thereby removing by thermal decomposition excessive Group III–V reactants that have deposited themselves on the decontamination film, covering the inner wall of the reactor and the holder.

5. The method of claim 4, wherein the step c) comprises depositing the Group III–V compound semiconductor film that has an aluminum mole fraction smaller than an aluminum mole fraction of the decontamination film.

6. The method of claim 4, wherein the step d) is carried out within a reducing environment.

7. The method of claim 6, wherein the reducing environment comprises hydrogen gas.

* * * * *

UNITED STATES PATENT AND TRADEMARK OFFICE
CERTIFICATE OF CORRECTION

PATENT NO.      : 6,569,238 B2
DATED           : May 27, 2003
INVENTOR(S)     : Masahiro Ishida It is certified that error appears in the above-identified patent and that said Letters Patent is hereby corrected as shown below:

<u>Title page,</u>
Item [54], Title, change "APPARATUS AND METHOD FOR DEPOSITING SEMI CONDUCTOR FILM" to -- APPARATUS AND METHOD FOR DEPOSITING SEMICONDUCTOR FILM --;
Item [75], Inventors, "Masahiro Ishida, Hirakata (JP)" to -- Masahiro Ishida, Osaka (JP) --;

Signed and Sealed this

Fourth Day of May, 2004

JON W. DUDAS
*Acting Director of the United States Patent and Trademark Office*